(12) United States Patent
Chang et al.

(10) Patent No.: US 8,772,120 B2
(45) Date of Patent: Jul. 8, 2014

(54) SEMICONDUCTOR PROCESS (75) Inventors: Chung-Fu Chang, Kaohsiung (TW);
Yu-Hsiang Hung, Tainan (TW);
Shin-Chuan Huang, Tainan (TW);
Chia-Jong Liu, Ping-Tung County
(TW); Yen-Liang Wu, Taipei (TW);
Pei-Yu Chou, Tainan (TW)

(73) Assignee: United Microelectronics Corp.,
Science-Based Industrial Park, Hsin-Chu
(TW)

( * ) Notice: Subject to any disclaimer, the term of this patent is extended or adjusted under 35 U.S.C. 154(b) by 0 days.

(21) Appl. No.: 13/479,279

(22) Filed: May 24, 2012

(65) Prior Publication Data

US 2013/0316506 A1 Nov. 28, 2013

(51) Int. Cl.
*H01L 21/336* (2006.01)

(52) U.S. Cl.
USPC ........................ 438/300; 438/303; 438/285

(58) Field of Classification Search
CPC ............ H01L 29/6636; H01L 29/6656; H01L 29/7848
USPC .................. 438/299, 300, 938, 301, 303; 257/E21.438
See application file for complete search history.

(56) References Cited

U.S. PATENT DOCUMENTS

| 5,447,884 | A | 9/1995 | Fahey | |
|---|---|---|---|---|
| 6,245,626 | B1 | 6/2001 | Chen | |
| 6,652,718 | B1 | 11/2003 | D'Couto | |
| 7,105,413 | B2 * | 9/2006 | Nahm et al. | 438/305 |
| 7,118,987 | B2 | 10/2006 | Fu | |
| 7,119,404 | B2 | 10/2006 | Chang | |
| 7,138,323 | B2 | 11/2006 | Kavalieros | |
| 7,271,464 | B2 | 9/2007 | Trivedi | |
| 7,314,793 | B2 | 1/2008 | Frohberg | |
| 7,396,728 | B2 | 7/2008 | Varghese | |
| 7,456,067 | B2 | 11/2008 | Ang | |
| 7,482,245 | B1 | 1/2009 | Yu | |
| 7,517,816 | B2 | 4/2009 | Frohberg | |
| 7,767,534 | B2 * | 8/2010 | Yang et al. | 438/299 |
| 2002/0135071 | A1 | 9/2002 | Kang | |
| 2003/0080361 | A1 * | 5/2003 | Murthy et al. | 257/288 |
| 2006/0001095 | A1 | 1/2006 | Doris | |
| 2006/0197161 | A1 | 9/2006 | Takao | |
| 2006/0281245 | A1 | 12/2006 | Okuno | |
| 2007/0122955 | A1 * | 5/2007 | Luo et al. | 438/197 |
| 2007/0141852 | A1 | 6/2007 | Stapelmann | |
| 2007/0200170 | A1 * | 8/2007 | Yamasaki et al. | 257/330 |
| 2008/0061366 | A1 | 3/2008 | Liu | |
| 2008/0173947 | A1 | 7/2008 | Hou | |
| 2008/0242020 | A1 | 10/2008 | Chen | |
| 2009/0159981 | A1 | 6/2009 | Niimi | |
| 2009/0230439 | A1 | 9/2009 | Wang | |
| 2009/0289284 | A1 | 11/2009 | Goh | |
| 2010/0184359 | A1 | 7/2010 | Park | |

* cited by examiner

*Primary Examiner* — Colleen Matthews
*Assistant Examiner* — Quovaunda V Jefferson
(74) *Attorney, Agent, or Firm* — Winston Hsu; Scott Margo (57) ABSTRACT

A semiconductor process includes the following steps. A gate structure is formed on a substrate. A main spacer is formed on the substrate beside the gate structure. A source/drain is formed in the substrate beside the main spacer. After the source/drain is formed, an epitaxial structure is formed in the substrate beside the main spacer. A gate structure may be respectively formed in a first area and a second area of a substrate. A main spacer is formed on the substrate respectively beside the two gate structures. A source/drain is formed in the substrate respectively beside the two spacers. After the two source/drains are formed, an epitaxial structure is formed in the substrate respectively beside the main spacers.

19 Claims, 6 Drawing Sheets

SEMICONDUCTOR PROCESS

BACKGROUND OF THE INVENTION

1. Field of the Invention

The present invention relates generally to a semiconductor process, and more specifically to a semiconductor process that forms an epitaxial structure after a source/drain is formed.

2. Description of the Prior Art

For decades, chip manufacturers have made metal-oxide-semiconductor (MOS) transistors faster by making them smaller. As the semiconductor processes advance to very deep sub micron era, such as 65-nm node or beyond, how to increase the driving current of MOS transistors has become a critical issue. In order to improve the device performances, crystal strain technology has been developed. Crystal strain technology is becoming more and more attractive as a mean for getting better performances in the field of CMOS transistor fabrication. Putting a strain on a semiconductor crystal alters the speed at which charges move through said crystal. Strain makes CMOS transistors work better by enabling electrical charges, such as electrons, to pass more easily through the silicon lattice of the gate channel.

In the known arts, attempts have been made to use a strained silicon layer, which has been grown epitaxially on a silicon substrate with a silicon germanium (SiGe) or a silicon carbide (SiC) layer disposed in between. In this type of MOS transistor, a biaxial tensile strain occurs in the epitaxy silicon layer due to the silicon germanium or the silicon carbide (SiC) which lattice constant is larger or smaller than the silicon one, and, as a result, the band structure is altered, and the carrier mobility increases. This enhances the speed performance of the MOS transistors.

However, the epitaxial layer such as the silicon germanium (SiGe) or silicon carbide (SiC) epitaxial layer will suffer thermal processes such as a source/drain annealing process or etc in semiconductor processes. These thermal processes cause dopants of the epitaxial layer to diffuse outwards, leading to electrons passing through the gate channels which provokes circuit leakage, and accordingly reduces the forcing stress effect of the epitaxial layer.

SUMMARY OF THE INVENTION

The present invention provides a semiconductor process that forms an epitaxial structure after a source/drain is formed, so that said problems can be solved.

The present invention provides a semiconductor process including the following steps. A gate structure is formed on a substrate. A main spacer is formed on the substrate beside the gate structure. A source/drain is formed in the substrate beside the main spacer. After the source/drain is formed, an epitaxial structure is formed in the substrate beside the main spacer.

The present invention provides a semiconductor process including the following steps. A gate structure is respectively formed in a first area and a second area of a substrate. A main spacer is respectively formed on the substrate beside the two gate structures. A source/drain is respectively formed in the substrate beside the two spacers. After the two source/drains are formed, an epitaxial structure is respectively formed in the substrate beside the main spacers.

According to the above, the present invention provides a semiconductor process that forms an epitaxial structure after a source/drain is formed. In this way, the epitaxial structure of the present invention can skip processes with a high processing temperature, such as a source/drain annealing process or the likes. Therefore, the problems of dopants out-diffusion can be avoided, so that circuit leakage caused by electrons passing through gate channels, and the reduction of forcing stress effect caused by the decreasing doped concentration of the epitaxial layer can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
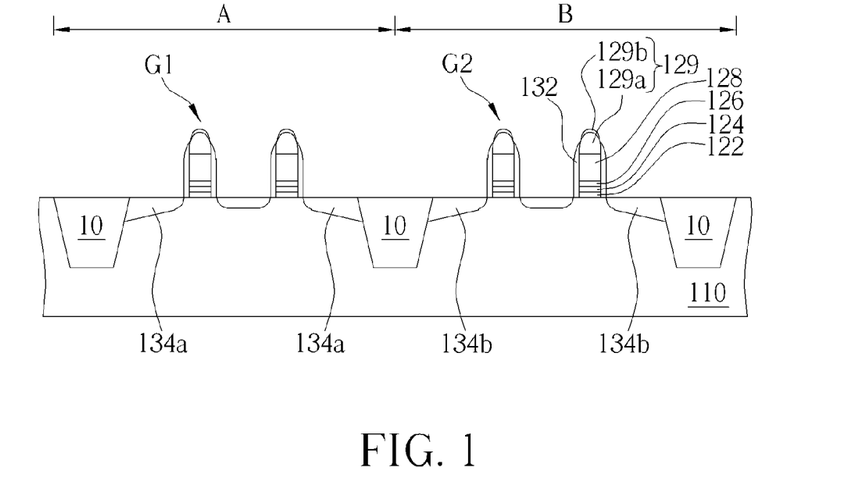
FIGS. 1-8 schematically depict cross-sectional views of a semiconductor process according to an embodiment of the present invention.

FIGS. 1-8 schematically depict cross-sectional views of a semiconductor process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. Isolation structures 10 are formed in the substrate 110. The isolation structures 10 may be shallow trench isolation (STI) structures, formed through a shallow trench isolation (STI) process, but it is not limited thereto. The details of the shallow trench isolation (STI) process are known in the art, and will therefore not be described herein. In this embodiment, the substrate 110 is divided into a first area A and a second area B by the isolation structures 10, wherein the first area A is used to form a PMOS transistor area, while the second area B is used to form an NMOS transistor area. However, in another embodiment, the first area A may also be used to form an NMOS transistor area while the second area B is used to form a PMOS transistor area, and the numbers of the transistors in the first area A or the second area B depend upon the needs.

A buffer layer (not shown), a gate dielectric layer (not shown), a barrier layer (not shown), a sacrificial electrode layer (not shown) and a cap layer (not shown) are sequentially formed from bottom to top, to cover the substrate 110. The cap layer (not shown), the sacrificial electrode layer (not shown), the barrier layer (not shown), the gate dielectric layer (not shown) and the buffer layer (not shown) are patterned to form two sacrificial gates G1 in the first area A and two sacrificial gates G2 in the second area B. The sacrificial gates G1 and the sacrificial gates G2 all include a buffer layer 122, a gate dielectric layer 124, a barrier layer 126, a sacrificial electrode layer 128 and a cap layer 129.

The buffer layer 122 may be an oxide layer, formed by a thermal oxide process or a chemical oxide process etc, but it is not limited thereto. The buffer layer 122 is located between the gate dielectric layer 124 and the substrate 110 to buffer the gate dielectric layer 124 and the substrate 110. In this embodiment, a gate-last for high-K first process is applied, so that the gate dielectric layer 124 may be a dielectric layer having a high dielectric constant, such as the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). The barrier layer 126 is located on the gate dielectric layer 124 to be used as an etching stop layer while the sacrificial electrode layer 128 is removed, to prevent the gate dielectric layer 124 from being etched, and to prevent metals above it from diffusing downward thereby polluting the gate dielectric layer 124. The barrier layer 126 may be a single layer structure or a multilayer structure composed of tantalum nitride (TaN), titanium nitride (TiN) or etc. The sacrificial electrode layer 128 may be composed of polysilicon, but it is not limited thereto. In this embodiment, the cap layer 129 may include a first cap layer 129a and a second cap layer 129b, wherein the first cap layer 129a and the second cap layer 129b have different materials, so as to have different etching rates during later etching processes. The different etching rates imply that they have different etching velocities during etching. For instance, the first cap layer 129a may be a nitride layer while the second cap layer 129b is an oxide layer, but it is not limited thereto. In another embodiment, the cap layer 129 may be composed of single material layer or multi material layers having combinations of various material layers. In another embodiment, a gate-last for high-K last process is applied, so that the gate dielectric layer 124 will be removed in later processes, and a gate dielectric layer having a high dielectric constant is then filled. Thus, the gate dielectric layer 124 may be just a sacrificial material easier to be removed in later processes, and the barrier layer 126 may not be formed.

A first spacer 132 may be respectively formed on the substrate 110 beside each of the sacrificial gates G1, G2. Then, a lightly doped source/drain ion implantation process (not shown) may be respectively performed to automatically align and form lightly doped source/drains 134a, 134b in the substrate 110 beside the sacrificial gates G1, G2. The first spacer 132 may be a single layer structure, a multilayer structure composed of silicon nitride or silicon oxide etc. The dopants doped into the lightly doped source/drains 134a formed beside the sacrificial gates G1 are suited for forming PMOS transistors, and the dopants doped into the lightly doped source/drains 134b formed beside the sacrificial gates G2 are suited for forming NMOS transistors.

Figure 2:
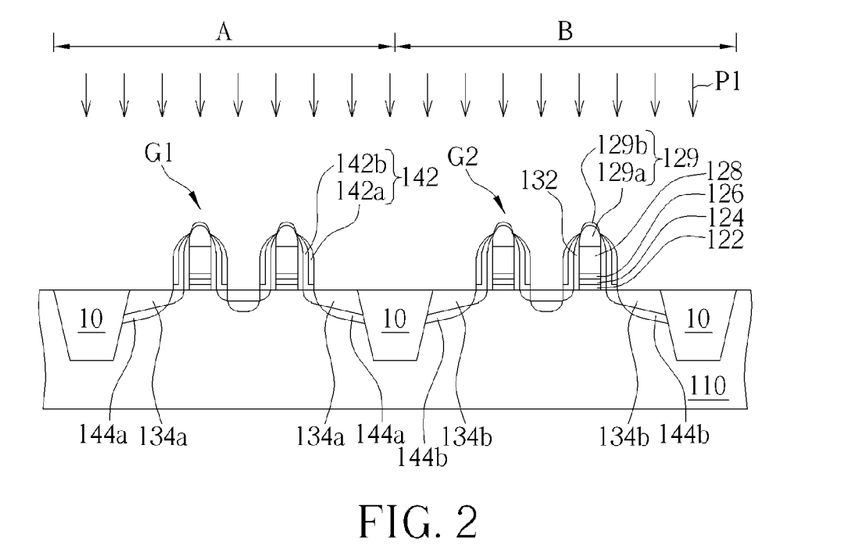

As shown in FIG. 2, a main spacer 142 is respectively formed on the substrate 110 beside each of the first spacers 132, and a source/drain ion implantation process P1 is respectively performed to automatically align and form source/drains 144a, 144b in the substrate 110 beside the main spacers 142. In details, the dopants doped into the source/drains 144a formed beside the sacrificial gates G1 are suited for forming PMOS transistors, and the dopants doped into the source/drains 134b formed beside the sacrificial gates G2 are suited for forming NMOS transistors. In this embodiment, the main spacer 142 is a dial spacer having an inner oxide layer 142a and an outer nitride layer 144b, but it is not limited thereto. In another embodiment, the main spacer 142 may be a single layer structure or a multilayer structure composed of silicon nitride or silicon oxide etc. It is mentioned that: the processing temperature of an annealing process performed after the source/drain ion implantation process P1 is performed and used to activate and drive-in the dopants doped into source/drains can be in a range of 1000° C.-1300° C. This temperature would induce the dopants doped into the source/drains to out diffuse, which affects the profile of the source/drains, thereby degrading the performances of formed semiconductor components. In this embodiment, the annealing process is therefore not performed right after the source/drain ion implantation process P1 is performed.

Figure 3:
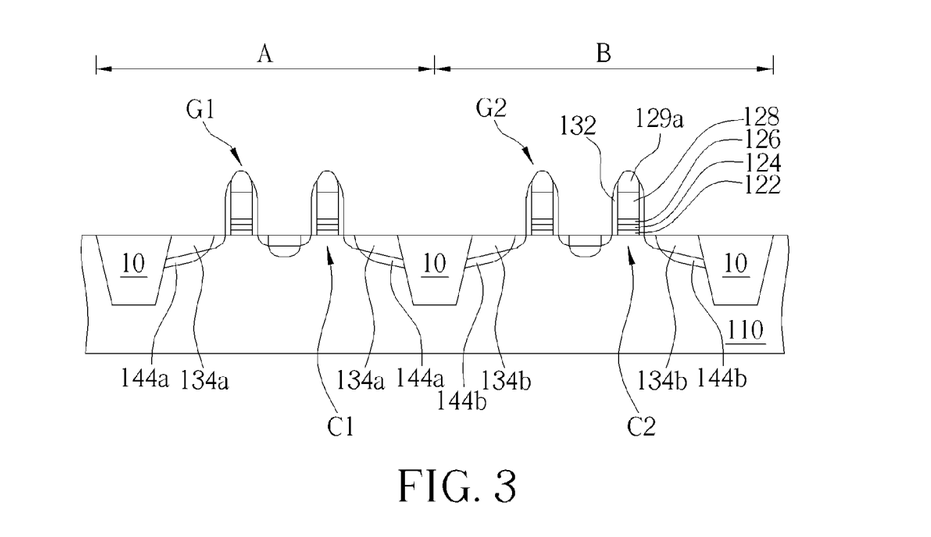

As shown in FIG. 3, after the source/drain ion implantation process P1 is performed, the main spacers 142 are partially or completely removed, enabling a stress layer formed on the gate structures G1, G2 in later process to be closer to the gate channels C1, C2, thereby increasing the stress forcing effect. Besides, epitaxial spacers can be formed in later processes to adjust the locations of formed epitaxial layers relative to the gate structures G1, G2. At this time, the second cap layer 129b is also removed while the main spacers 142 are removed, but the second cap layer 129b can prevent the first cap layer 129a beneath it from being damaged.

Figure 4:
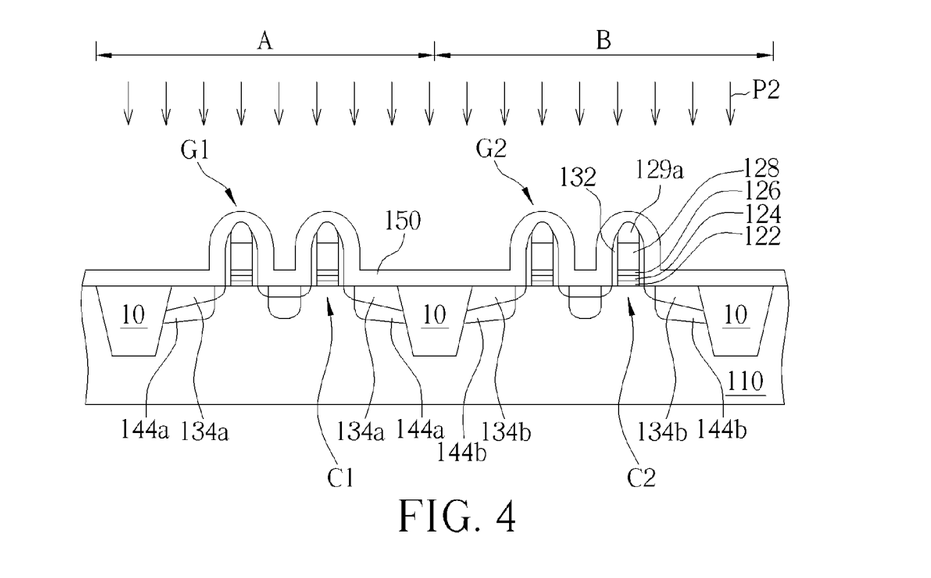

As shown in FIG. 4, a stress memorization technique (SMT) may be selectively performed. For instance, a stress layer 150 is formed to cover the gate structures G1, G2 and the substrate 110. The stress layer 150 may be a nitride layer having the capability of forcing stresses. For example, the stress layer 150 of an NMOS transistor area may have a tensile stress, and the stress layer 150 of a PMOS transistor area may have a compressive stress, but it is not limited thereto. Then, a source/drain annealing process P2 is performed to enable stresses applied on the gate channels C1, C2 by the stress layer 150 to be kept in the gate channels C1, C2. Therefore, the carrier mobility of the gate channels C1, C2 is increased, and the source/drains 144a, 144b are activated.

It is emphasized that, the source/drain ion implantation process P1 is performed, the stress layer 150 is formed, and then the source/drain annealing process P2 is performed in this embodiment, so that the annealing process just needs to be performed once, which means that the source/drain annealing process P2 can keep stresses into the gate channels C1, C2, and the source/drains 144a, 144b can be activated. Thus, the stress memorization technique (SMT) process and the source/drains 144a, 144b forming processes can be finished through performing the annealing process once in this embodiment. However, the processing orders are not limited thereto. For example, in another embodiment, the source/drain annealing process P2 may be performed right after the source/drain ion implantation process P1 is performed, and a stress memorization annealing process (not shown) may be performed to keep stresses into the gate channels C1, C2 after the stress layer 150 is formed.

Figure 5:
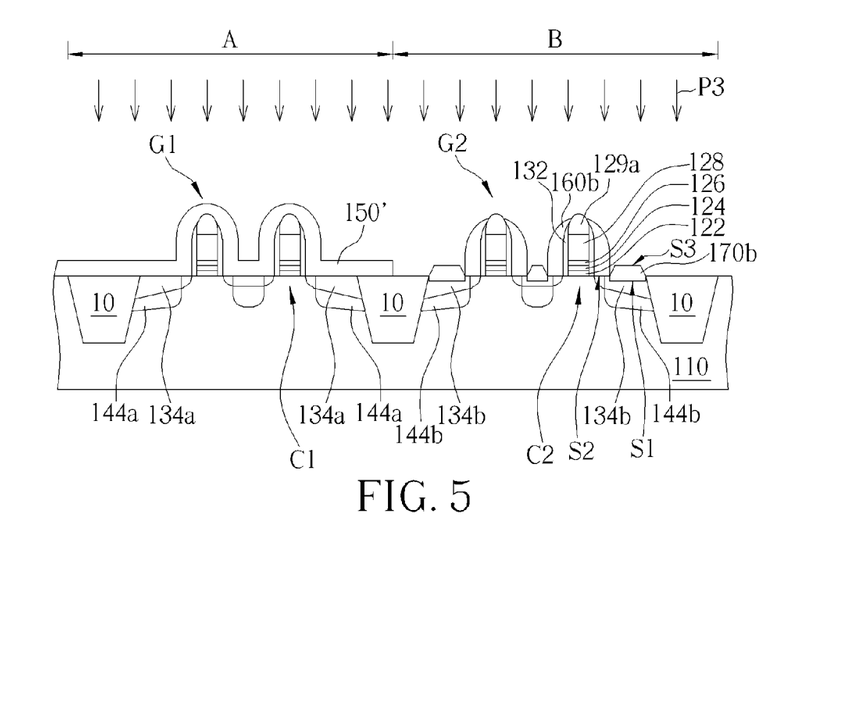

After the source/drain annealing process P2 is finished, as shown in FIGS. 5-8, a first epitaxial spacers 160b and a second epitaxial spacers 160a are respectively formed on the substrate 110 beside each of the gate structures G2, G1, so that a first epitaxial structure 170b and a second epitaxial structures 170a can be automatically aligned and formed respectively in the substrate 110 beside each of the first epitaxial spacers 160b and the second epitaxial spacers 160a. In details, as shown in FIG. 5, a photolithography process is performed to pattern the stress layer 150 in the second area B to form first epitaxial spacers 160b and keep the stress layer 150' in the first area A. More precisely, a photoresist (not shown) may be formed firstly on the stress layer 150 and the photoresist (not shown) is patterned to expose the second area B. Then, a spacer etching process (not shown) is performed to form the first epitaxial spacers 160b, while keeping the stress layer 150' in the first area A. Finally, the photoresist (not shown) is removed.

An epitaxial process P3 is performed to form first epitaxial structures 170b in the substrate 110 beside the first epitaxial spacers 160b. The epitaxial process P3 may be carried out through an in-situ doping epitaxial process, but it is not limited thereto. In this embodiment, the first epitaxial structures 170b are formed in the second area B, suited for forming epitaxial structures of an NMOS transistor, so that the first epitaxial structures 170b may include a silicon phosphorus (SiP) epitaxial structure or a carbon-containing silicon phosphorus (SiCP) epitaxial structure but not limited thereto. Due to the substrate 110 uncovered by the first epitaxial spacers 160b and the stress layer 150' etched through said spacer etching process, the bottom surfaces S1 of the first epitaxial structures 170b will slightly lower the top surface S2 of the substrate 110. In one case, the bottom surfaces S1 of the first epitaxial structures 170b may be 60~70 Å (angstrom) lower than the top surface S2 of the substrate 110, but it is not limited thereto. Furthermore, the surface S3 of the first epitaxial structures 170b is higher than the surface S2 of the substrate 110, so that a part of the first epitaxial structures 170b can be consumed by later processes without affecting the performances of the formed semiconductor components, wherein the later processes may be a salicide process or a contact plug process but not limited to.

Figure 6:
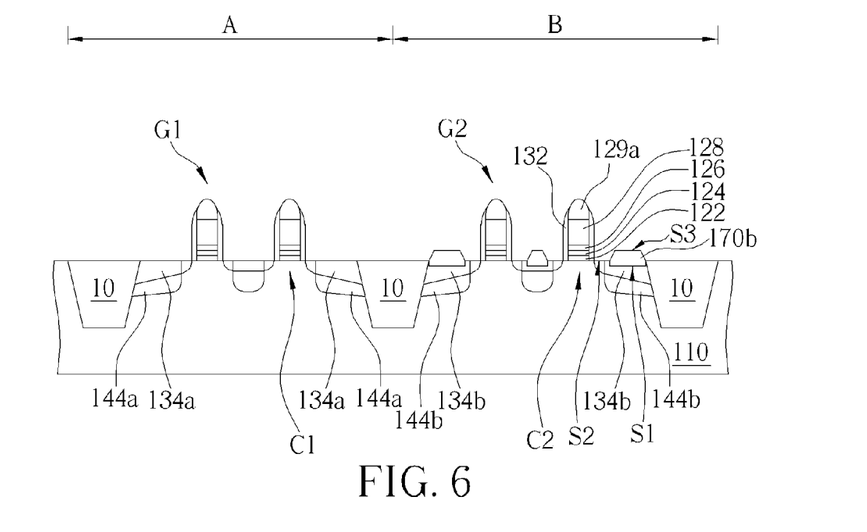
Figure 7:
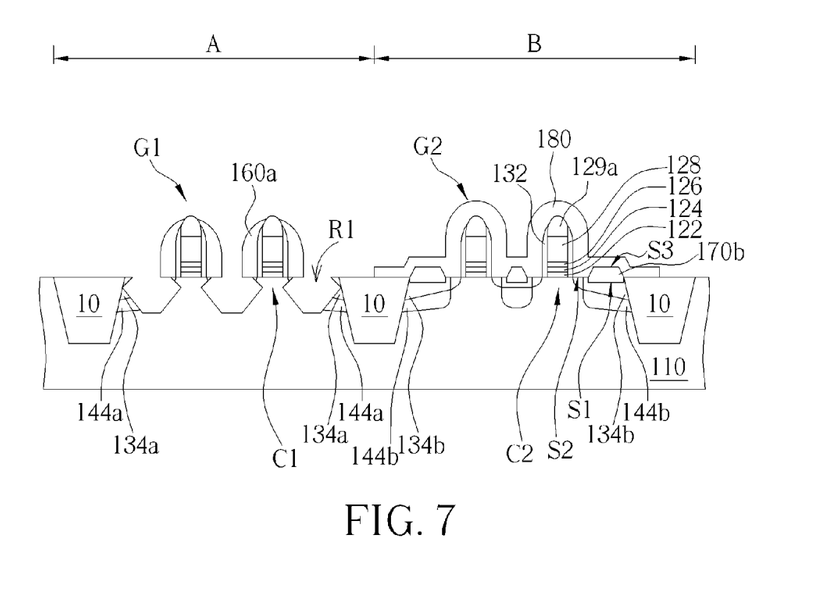
Figure 8:
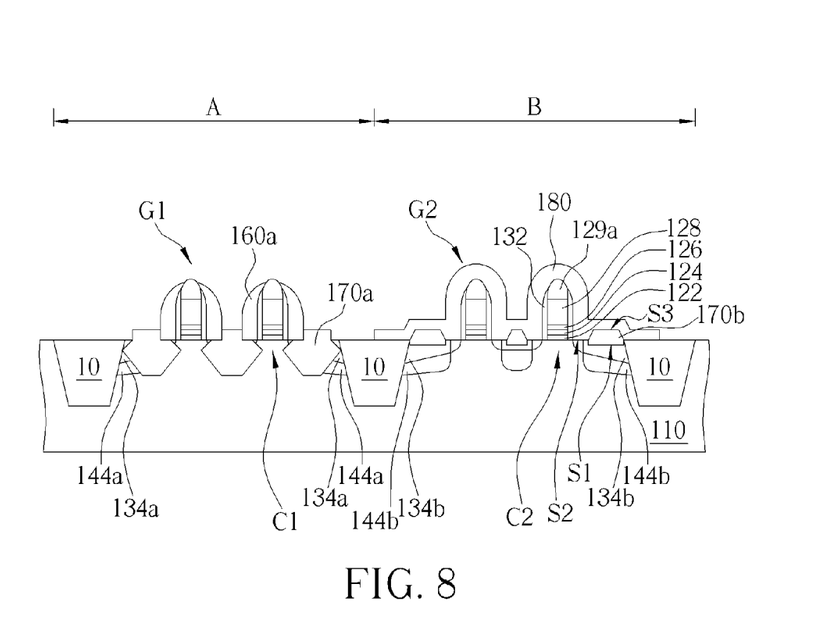

As shown in FIG. 6, the first epitaxial spacers 160b and the stress layer 150' are removed. Then, as shown in FIG. 7, a material layer 180 is formed to entirely cover the second area B, and second epitaxial spacers 160a are formed simultaneously. In details, a photoresist (not shown) may be formed and patterned to expose the first area A, and then a spacer etching process (not shown) is performed to form the second epitaxial spacers 160a while keeping the material layer 180 in the second area B. Finally, the photoresist (not shown) is removed. By using the second epitaxial spacers 160a as hard masks, another etching process (not shown) is performed to etch the substrate 110, and recesses R1 in the substrate 110 beside the second epitaxial spacers 160a are therefore formed. In one case, the depth of the recess R1 may be in a range of 600~700 Å (angstrom), but it is not limited thereto. As shown in FIG. 8, second epitaxial structures 170a are formed in the first area A. The second epitaxial structures 170a may be formed by an in-situ doping epitaxial process, but it is not limited thereto. In this embodiment, the second epitaxial structures 170a are suited for being epitaxial structures of a PMOS transistor, so that the second epitaxial structures 170a may include a silicon germanium epitaxial structure or a boron-containing silicon germanium epitaxial structure but not limited to. Thereafter, anion implantation process (not shown) may be selectively performed on the second epitaxial structures 170a or the first epitaxial structures 170b to increase the doping concentrations of the second epitaxial structures 170a or the first epitaxial structures 170b.

The material layer 180 and the second epitaxial spacers 160a may be selectively removed. Then, later semiconductor processes may be performed. For example, a salicide process may be performed to form metal silicide on the source/drains 144a, 144b; a contact etch stop layer (CESL) (not shown) may cover the substrate 110; an interdielectric layer (not shown) may cover the substrate 110 and each of the sacrificial gates G1, G2, and then the interdielectric layer is patterned to form a planarized interdielectric layer (not shown) and expose the sacrificial electrode layer 128. Then, the sacrificial electrode layer 128 may be replaced by metal gates (not shown); or etc. These semiconductor processes are known in the art, and will therefore not be described herein.

Figure 9:
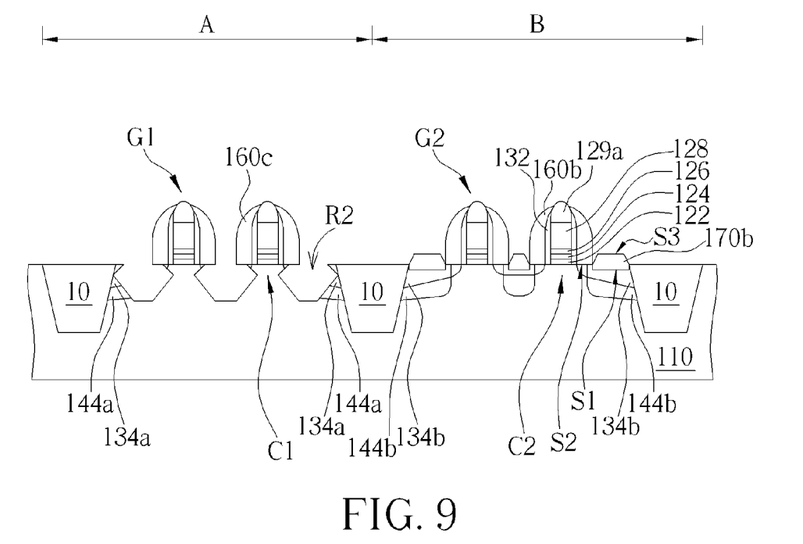
FIG. 9 schematically depicts a cross-sectional view of a semiconductor process according to another embodiment of the present invention.

As shown in FIGS. 6-8, after the first epitaxial structures 170b are removed (as shown in FIG. 5), the first epitaxial spacers 160b and the stress layer 150' are removed, and then the second epitaxial spacers 160a and the material layer 180 are formed to form the second epitaxial structures 170a. In another embodiment, as shown in FIG. 9, after the first epitaxial structures 170b are removed (as shown in FIG. 5), the stress layer 150' in the first area A may be patterned to form second epitaxial spacers 160c, and recesses R2 are therefore formed to form the second epitaxial structures (not shown).

Above all, in the present invention, the first epitaxial structures 170b and the second epitaxial structures 170a are formed after the source/drains 144a, 144b are formed. Therefore, the first epitaxial structures 170b and the second epitaxial structures 170a will not suffer the processes of forming the source/drains 144a, 144b, such as the source/drain ion implantation process P1 (that causes damage) and the source/drain annealing process P2 (the high processing temperature has reversely affection). As a result, the problems of dopants out-diffusion can be avoided, so that circuit leakage caused by electrons passing through gate channels can be avoided, and the reduction of stress forcing effect caused by the decreasing doping concentration of the epitaxial layer can be prevented. Moreover, the processing temperature of the epitaxial processes will also induce dopants in the epitaxial structures to out-diffuse; the performing time of the epitaxial structures 170b or the second epitaxial structures 170a can therefore be traded off and the orders of forming the epitaxial structures 170b and the second epitaxial structures 170a can be reconsidered according to electrical requirements.

There are two transistors processes, such as CMOS transistor processes, presented above, but the present invention can also be applied to single MOS transistor processes, that forms epitaxial structures after the source/drains are formed.

Figure 10:
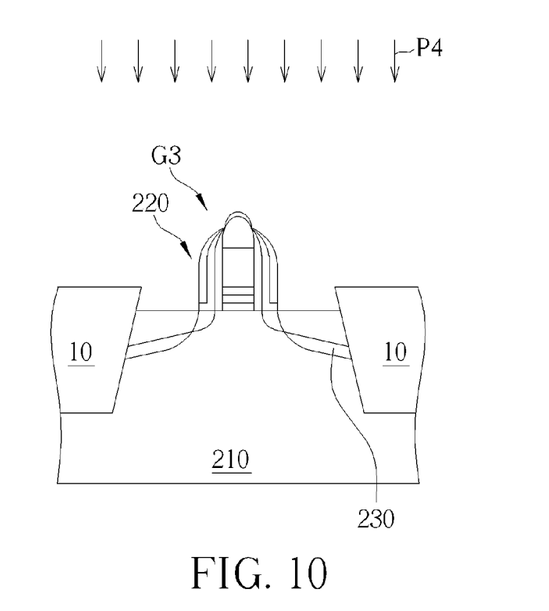
FIGS. 10-11 schematically depict cross-sectional views of a semiconductor process according to a still embodiment of the present invention.
Figure 11:
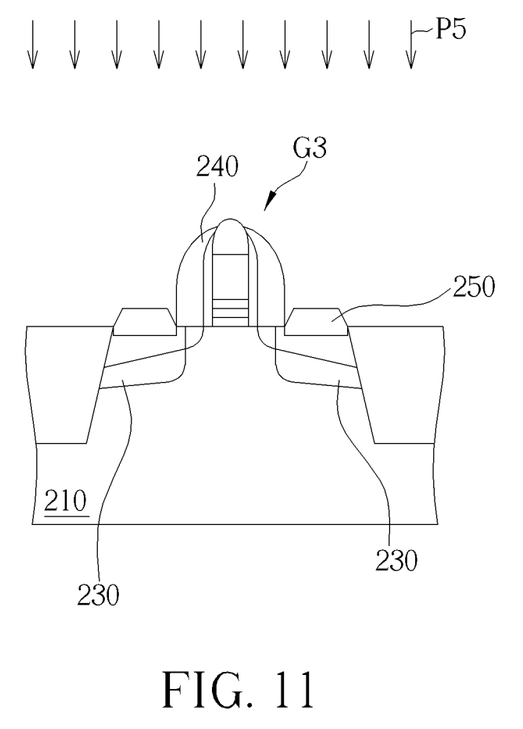

FIGS. 10-11 schematically depict cross-sectional views of a semiconductor process according to a still embodiment of the present invention. As shown in FIG. 10, a source/drain ion implantation process P4 is performed to form a source/drain 230 in a substrate 210 beside a main spacer 220. The source/drain 230 is suited for use in a PMOS transistor or an NMOS transistor, depending upon the needs. The methods for forming other semiconductor components such as a sacrificial gate G3 the likes (other semiconductor processes may be performed before the source/drain 230 is formed) are the same as said embodiments, and will therefore not be described again. As shown in FIG. 11, after the source/drain annealing process for forming the source/drain 230 is performed, an epitaxial spacer 240 is formed to replace the main spacer 220 for defining the location of the epitaxial structure. A recess (not shown) is therefore formed. An epitaxial process P5 is performed to form an epitaxial structure 250 in the substrate 210 beside the sacrificial gate G3. Some steps may be included after the source/drain 230 is formed (as shown in FIG. 10) and before the epitaxial structure 240 is formed (as shown in FIG. 11). For example, the main spacer 210 is removed; the stress layer (not shown) may be formed or etc. These steps are similar to previous embodiments, and will therefore not be described again.

Moreover, planar MOS transistors are applied in said embodiments, but the present invention can also be applied to tri-gate MOSFETs or fin field effect transistor (Fin FET), etc. Applications are similar to the applications of the planar MOS transistors, which means that epitaxial structures formed in fin-shaped structures are formed after the source/drain ion implantation process and the source/drain annealing process are performed, and will therefore not described again.

To summarize, the present invention provides a semiconductor process that forms an epitaxial structure after a source/drain is formed. In this way, the epitaxial structure of the present invention can skip processes having a high processing temperature, such as a source/drain annealing process. Therefore, the problems caused by dopants out-diffusion can be avoided. Circuit leakage caused by electrons passing through gate channels, and reduction of the forcing stress effect caused by the decreasing doping concentration of the epitaxial layer can be prevented. Moreover, the dopants doped in the epitaxial structures will be induced out of said structures because of the high processing temperatures of the epitaxial process, and the high temperatures will have affect differently the structures, according to their electrical type. The epitaxial structures that will be the most affected by the high processing temperatures of the epitaxial process can be formed in later processes. Thus, the electrical performances of the formed semiconductor components can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
    forming a gate structure on a substrate;
    forming a main spacer on the substrate beside the gate structure;
    forming a source/drain in the substrate beside the main spacer;
    removing the main spacer;
    forming an epitaxial spacer on the substrate beside the gate structure after the main spacer is removed;
    forming a recess in the substrate beside the epitaxial spacer; and
    performing an epitaxial process to form an epitaxial structure in the recess after the source/drain is formed.

2. The semiconductor process according to claim 1, wherein the steps of forming the source/drain comprise:
    performing a source/drain ion implantation process to form the source/drain in the substrate beside the main spacer; and
    performing a source/drain annealing process to activate the source/drain.

3. The semiconductor process according to claim 1, further comprising:
    performing a stress memorization technique (SMT) to the substrate beneath the gate structure before the epitaxial structure is formed.

4. The semiconductor process according to claim 3, wherein the steps of performing the stress memorization technique (SMT) and forming the source/drain comprise:
    performing a source/drain ion implantation process to form the source/drain in the substrate beside the main spacer;
    forming a stress layer to cover the gate structure and the substrate; and
    performing a source/drain annealing process to enable the stress layer to force stress to the substrate beneath the gate structure and to activate the source/drain.

5. The semiconductor process according to claim 4, further comprising:
    removing the main spacer before the stress layer is formed, and etching the stress layer to form the epitaxial spacer before the epitaxial structure is formed.

6. The semiconductor process according to claim 1, wherein forming the epitaxial structure comprises performing an in-situ doping epitaxial process.

7. The semiconductor process according to claim 1, further comprising:
    performing an ion implantation process in the epitaxial structure after the epitaxial structure is formed.

8. The semiconductor process according to claim 1, further comprising:
    forming a first spacer on the substrate beside the gate structure before the main spacer is formed; and
    forming a lightly doped source/drain in the substrate beside the first spacer.

9. The semiconductor process according to claim 1, wherein the epitaxial structure comprises a silicon phosphorus (SiP) epitaxial structure, a silicon germanium (SiGe) epitaxial structure or a carbon-containing silicon phosphorus (SiCP) epitaxial structure.

10. A semiconductor process, comprising:
    forming a gate structure in a first area and a second area of a substrate respectively;
    forming a main spacer on the substrate beside the two gate structures, respectively;
    forming a source/drain in the substrate beside the two main spacers, respectively;
    removing the two main spacers;
    forming an epitaxial spacer on the substrate beside the two gate structures, respectively; and
    self-aligning and forming two epitaxial structures in the substrate by the two epitaxial spacers beside the two gate structures, respectively, after the two source/drains are formed.

11. The semiconductor process according to claim 10, wherein the steps of forming the two source/drains comprise:
    performing a source/drain ion implantation process to form the two source/drains; and
    performing a source/drain annealing process to activate the two source/drains.

12. The semiconductor process according to claim 10, further comprising:
    performing a stress memorization technique (SMT) to the substrate beneath the two gate structures before the two epitaxial structures are formed.

13. The semiconductor process according to claim 12, wherein the steps of performing the stress memorization technique (SMT) and forming the two source/drains comprise:
    performing a source/drain ion implantation process to form the two source/drains in the substrate beside the two main spacers;
    forming a stress layer to cover the two gate structures and the substrate;
    performing a source/drain annealing process to enable the stress layer to force stresses to the substrate beneath the two gate structures and to activate the two source/drains.

14. The semiconductor process according to claim 13, further comprising:
    removing the two main spacers before the stress layer is formed, and etching the stress layer to form the epitaxial spacer respectively before the two epitaxial structures are formed.

15. The semiconductor process according to claim 13, further comprising:
    removing the two main spacers before the stress layer is formed, and etching the stress layer in the first area to form an epitaxial spacer in the first area before the two epitaxial structures are formed;
    forming the epitaxial structure in the first area;
    removing the remaining stress layer and the epitaxial spacer in the first area completely;

covering and patterning a material layer to enable the material layer to cover the first area and form an epitaxial spacer in the second area; and forming the epitaxial structure in the second area.

16. The semiconductor process according to claim 10, wherein the two epitaxial structures all comprise a silicon phosphorus (SiP) epitaxial structure, a silicon germanium (SiGe) epitaxial structure or a carbon-containing silicon phosphorus (SiCP) epitaxial structure.

17. The semiconductor process according to claim 10, wherein forming the epitaxial structures comprises performing an in-situ doping epitaxial process.

18. The semiconductor process according to claim 10, further comprising:

forming a first spacer on the substrate beside the two gate structures respectively before the main spacers are formed; and forming a lightly doped source/drain in the substrate beside the first spacers respectively.

19. The semiconductor process according to claim 10, further comprising:

performing an ion implantation process on at least one of the two epitaxial structures after the two epitaxial structures are formed.

* * * * *